United States Patent
Hong (12) 
(10) Patent No.: US 6,496,058 B1
(45) Date of Patent: Dec. 17, 2002

(54) METHOD FOR DESIGNING AN INTEGRATED CIRCUIT CONTAINING MULTIPLE INTEGRATED CIRCUIT DESIGNS AND AN INTEGRATED CIRCUIT SO DESIGNED

(75) Inventor: Joseph Hong, Fremont, CA (US)

(73) Assignee: Virtual IP Group, Sunnyvale, CA (US)

( * ) Notice: Subject to any disclaimer, the term of this patent is extended or adjusted under 35 U.S.C. 154(b) by 0 days.

(21) Appl. No.: 09/912,588

(22) Filed: Jul. 24, 2001

(51) Int. Cl.[7] .............................................. H01L 25/00
(52) U.S. Cl. ........................... 327/565; 326/41; 326/86; 710/31; 710/38
(58) Field of Search ................................ 327/407, 408, 327/415, 416, 565, 566; 326/41, 47, 86, 37, 38; 710/31, 38

(56) References Cited

U.S. PATENT DOCUMENTS

| | | | | |
|---|---|---|---|---|
| 4,600,995 A | * | 7/1986 | Kinoshita | 327/565 |
| 4,945,395 A | * | 7/1990 | Suehiro | 257/203 |
| 5,233,241 A | * | 8/1993 | Nishimori | 326/38 |
| 5,974,245 A | | 10/1999 | Li et al. | 716/10 |

* cited by examiner

*Primary Examiner*—Tuan T. Lam
(74) *Attorney, Agent, or Firm*—Lumen Intellectual Property Services (57) ABSTRACT

A multi-design integrated circuit having I/O buffers that are shared by multiple designs in the integrated circuit, the multi-design integrated circuit being designed by combining netlists and pin-pad assignment lists for the individual designs into one overall netlist or multi-design netlist.

6 Claims, 8 Drawing Sheets

METHOD FOR DESIGNING AN INTEGRATED CIRCUIT CONTAINING MULTIPLE INTEGRATED CIRCUIT DESIGNS AND AN INTEGRATED CIRCUIT SO DESIGNED

FIELD OF THE INVENTION

This invention relates to the field of semiconductor integrated circuits. The invention particularly relates to methods for designing and manufacturing integrated circuits, and to integrated circuits so produced.

BACKGROUND OF THE INVENTION

The creation of a new semiconductor integrated circuit includes the following activities. Integrated circuit designers start with some description of the circuit's function. From this description or specification, the designers generate a design netlist. The design netlist contains a list of the components of the circuit and also contains a list of the interconnections between those components. The design netlist also contains a list of I/O buffers with their associated bonding pads and their connections to the other components. The designers then apply electronic design automation (EDA) tools to the netlist to create the physical layout of the components as they will appear in the integrated circuit die. With present day semiconductor technology, and using 0.25 micron feature size, designers can put up to 2 million logic gates and up to 250 input/output (I/O) ports on a 7 mm by 7 mm die. The majority of designs at this date, however, contain only about 50K to 80K gates of logic and about 200 I/O's.

The physical layout of a 0.25 $\mu$m design consists of a set of about 18 to 26 unique mask levels. This information is supplied to a mask-making facility where the information is used to generate a set of glass masks for that particular design.

The mask set is then sent to a wafer fabrication facility where the mask set is applied to process a batch of about 20 semiconductor wafers. After the wafers have been completely processed, they are sent to wafer electrical test where dice that do not meet specification are inked or otherwise marked reject. The tested wafers are then sawn into individual dice, each die containing one integrated circuit. The dice are packaged and then electrically tested in a procedure known generally as final test. Based on the wafer electrical probe test results and the final test results, it may be necessary to correct the design and generate a second generation design with a second generation mask set. The costs associated with the design and prototyping activities just described are quite substantial.

There are several methods in use currently that aim to share some of the costs of the activities mentioned above.

So-called Gate Arrays provide one method of sharing costs. At this date, a mask set may have from 18 to 26 levels in a typical 0.25 micron CMOS process. In the gate array method, the first two thirds of these mask levels are common to all designs. Only the final one third of the mask levels are specific to each new design. The benefit here is that the first two thirds of the masks do not have to be designed and made anew for each new integrated circuit design and also that wafer fabrication time for a new design can be reduced by processing wafers in advance through the common masks and holding the partially processed wafers in stock ready to continue prototype processing through the last one third of the mask layers.

There are disadvantages to the gate array approach. Since the basic transistors have to be fabricated ahead of time, they all have to be of standard fixed sizes. Without the flexibility of being able to use varying transistor sizes in different parts of the new circuit design and of adding user-specific circuit components, the integrated circuit size increases and the performance degrades. The engineering costs to generate each design layout and to personalize the last one third of the mask layers are incurred for each design and are not sharable. Another disadvantage is the inability to incorporate custom-designed blocks such as analog cells or true static random access memory (SRAM) blocks. With the increasing levels of integration that are now available in deep submicron process technologies, almost all designs made today in 0.25 micron or better technologies incorporate some amount of SRAM.

Another approach to sharing prototyping costs is known as the multi-project wafer approach. In the multi-project approach, several projects, or integrated circuit designs, are combined in one mask set. Each design has its own bonding pads and input/output buffers located around the periphery of that design. In this approach, certain procurement costs are shared between the different designs that are included in the one mask set. If different users own the different designs on a given mask set, then the mask cost and wafer fabrication cost is reduced for each user. There are several organizations now running multi-project wafer programs. Among these is MOSIS, a not-for-profit organization located in southern California.

The multi-project wafer approach has some disadvantages. For example, since the several different designs in a multi-project die have their own unique bonding pads, probe testing at the wafer level is difficult in a production environment. Assembly of these designs into integrated circuit packages is difficult because of complications in the wafer sawing process. When a semiconductor wafer is sawed into dice, the entire wafer has to be sawed at a fixed indexing increment. In the multi-project approach, if there are 10 designs of different die sizes on the wafer, the saw is indexed to yield dice containing 1 of the designs, and thus the saw destroys other designs. Also, if one of the designs is to go into production, a new mask set will need to be made, containing only that design. Cost sharing is possible only at the prototyping stage and not at the production stage.

Therefore, there is a need for an integrated circuit architecture that provides multiple integrated circuit designs in a single die, wherein all of the designs on a die are testable at wafer probe test, and wherein all of the designs survive the wafer sawing operation and the package assembly operation, thus providing complete cost sharing from design through final test. There is also a need for an integrated circuit architecture that, during assembly, allows any number of the designs to be made accessible or inaccessible in the packaged device. There is also a need for a design method that produces this integrated circuit architecture.

OBJECTS AND ADVANTAGES

It is an object of the present invention to provide a multi-design integrated circuit die that contains multiple integrated circuit designs and a set of bonding pads that is shared by the different designs on the die.

It is an object of the present invention to provide a multi-design integrated circuit, in which the multiple circuit designs in the integrated circuit can be probe tested via one set of shared bonding pads.

It is a further object of the present invention to provide a multi-design integrated circuit die that has bonding pads located, not around each design, but rather in an area of the die near the periphery of the multi-design die.

It is a further object of the present invention to provide a multi-design integrated circuit die, in which, after the die has been assembled into an integrated circuit package, any of the circuit designs can be accessed.

It is a further object of the present invention to provide a design method for designing multi-design integrated circuits.

It is a further object of the present invention to provide an automated design method for designing multi-design integrated circuits.

It is a further object of the present invention to provide an automated design method for designing a multi-design integrated circuit die that not only provides cost sharing during prototyping but that is also production-ready.

It is a further object of the present invention to provide an automated design method for designing a multi-design integrated circuit die that allows the designer freedom to customize the individual components in each design within the integrated circuit die.

SUMMARY

The objects and advantages of the present invention are obtained by generating a multi-design netlist that contains and is a combination of individual design netlists and that shares I/O buffers among designs. The objects and advantages of the present invention are further obtained by using the multi-design netlist and masks derived from it to process semiconductor wafers to obtain multi-design integrated circuit dice. The semiconductor wafers would most commonly be silicon wafers but may also be any other semiconductor such as for example gallium arsenide, and may also be semiconductor on insulator wafers such as for example silicon on sapphire.

In one aspect, the method of the present invention is a method of design and layout of a set of integrated circuit designs, the set of designs being combined on a single integrated circuit die. The set of designs may include only two designs or may include ten or more designs. In the method of the present invention, netlists are prepared for each of the designs in the set of designs that is to be incorporated in a single die (also called a chip). Each design netlist includes a pin-pad assignment table. The pin-pad assignment table for a design assigns numbered package pins to numbered bonding pads on a one to one basis. This pin-pad assignment would apply if the die contained only that one design, in which case that one design would have its own bonding pads and I/O buffers.

In the multi-design integrated circuit die, the individual designs do not each have their own I/O buffers and bonding pads, but they do have corresponding input and output connection points, which, for convenience, will be referred to herein as ports.

The netlists for the individual designs are combined by a computer program into one multi-design netlist. The multi-design netlist includes a pin-pad assignment table that assigns numbered ports of each design to numbered I/O buffers, to numbered bonding pads, and to numbered package pins. The multi-design netlist includes, in addition to the netlists for the individual designs, provision for accessing the designs via shared bi-directional input/output buffers, and also includes logic for enabling only the outputs of one design at a time. EDA tools are then applied to the multi-design netlist to generate mask layouts. The mask layouts are used in a mask making facility to produce a mask set. The mask set is used to process silicon wafers. After fabrication is completed, the wafers are electrically probe tested. In this procedure, probes are placed on bonding pads on a die and each of the designs can be tested. The testing of all the designs on the die can be completed in one probing operation, each of the designs being operated in turn. The wafer is then cut into individual dice, each die containing the set of designs. Each die is then assembled into a semiconductor package with connections between bonding pads and package pins being made in accordance with the pin-pad assignment table. During assembly, access to the various designs in the multi-design integrated circuit can be restricted or can be left unrestricted. In either case, access to any design is made by applying appropriate signals to design active pins.

In another aspect, the integrated circuit die of the present invention is a multi-design integrated circuit die that contains at least two integrated circuit designs, wherein each of the designs may be operated independently of the others. The design that is to be operated is designated the active design. The selection of an active design is made by supplying design active signals to the die and the selection may be easily changed.

Shared bonding pads and shared bi-directional I/O buffers provide access for input and out put signals to whichever design is active.

Input signals are applied to bonding pads and pass through I/O buffers to the designs. Each input signal is distributed to the number of designs that require that signal in the overall design. Thus, at least some of the I/O buffers pass input signals to two or more designs. An I/O buffer may be connected to send an input signal to all the designs.

Output control logic is connected between the designs and the I/O buffers so that the output signals reaching the bonding pads are from the active design only.

The output control logic includes output enable control logic wherein an output enable signal from a design is passed to an I/O buffer only if that design is active.

The output control logic also includes, when more than one design is served by a given I/O buffer, output selection logic which selects the output of the active design for transmission to the I/O buffer.

In the layout of the integrated circuit die of the present invention the shared bonding pads and I/O buffers are located near the periphery of the die and the designs are located in the central or core area of the die.

DETAILED DESCRIPTION OF THE INVENTION

Figure 1:
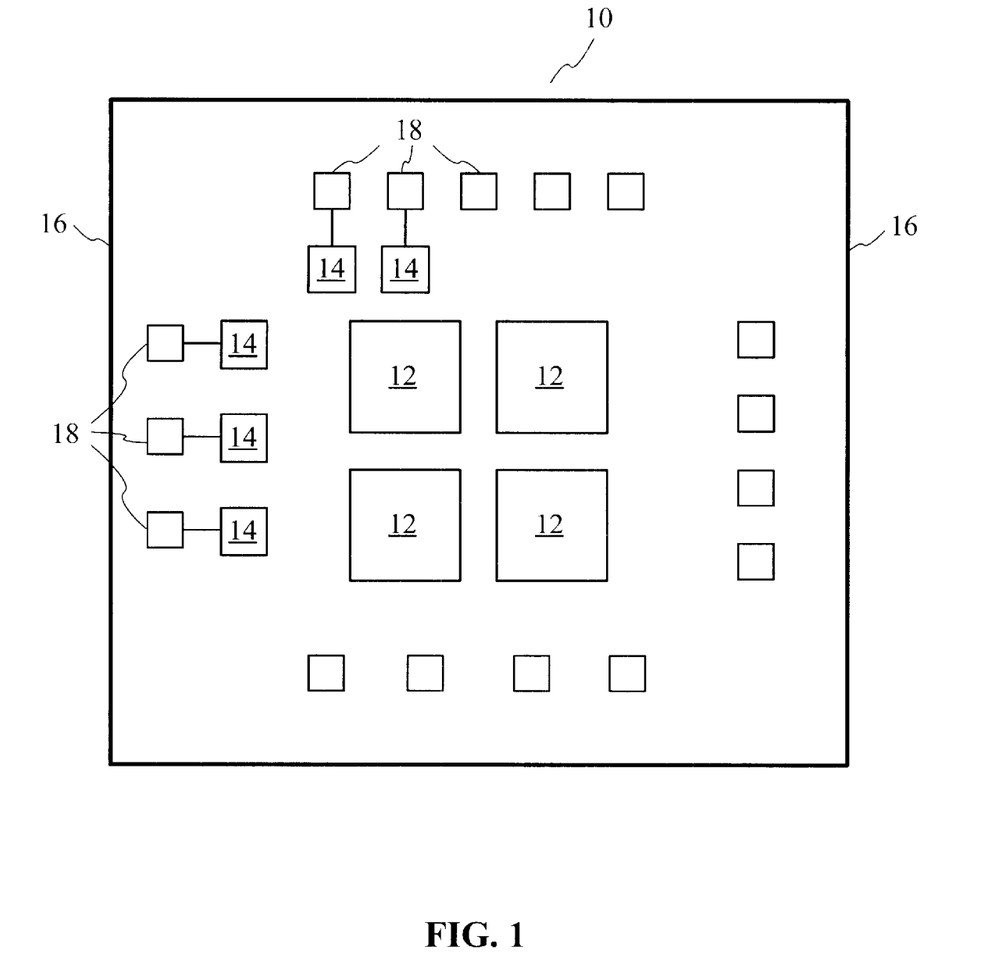
FIG. 1 shows the general layout of a multi-design integrated circuit die in accordance with the present invention.

FIG. 1 shows a simplified layout for a multi-design integrated circuit die in accordance with the present invention. In FIG. 1 only the top surface of the die is shown. The multi-design die 10 contains designs 12. In FIG. 1, by way of example, the die contains a set of four designs. The number of designs could be as small as two or as large as 20 or more. These designs 12 can be of different levels of complexity and of different shapes. In FIG. 1 the designs 12 are located in the central or core portion of the chip. FIG. 1 also shows shared I/O buffers 14 located near the periphery 16 of the die 10. Each I/O buffer 14 is connected to its assigned bonding pad 18. The bonding pads may be replaced by any other suitable type of mechanical connection, such as solder bumps. There are connections between the I/O buffers 14 and the designs 12 but these connections are not shown.

The design process for the multi-design die 10 of FIG. 1 includes generating, for each design 12, a separate netlist. The netlist for a single design 12 may be referred to as a sub-netlist or a lower level netlist. These netlists are combined and augmented to produce a super-netlist, which may also be called an upper level netlist, that includes shared I/O buffers and the connections between I/O buffers and the designs.

Figure 2:
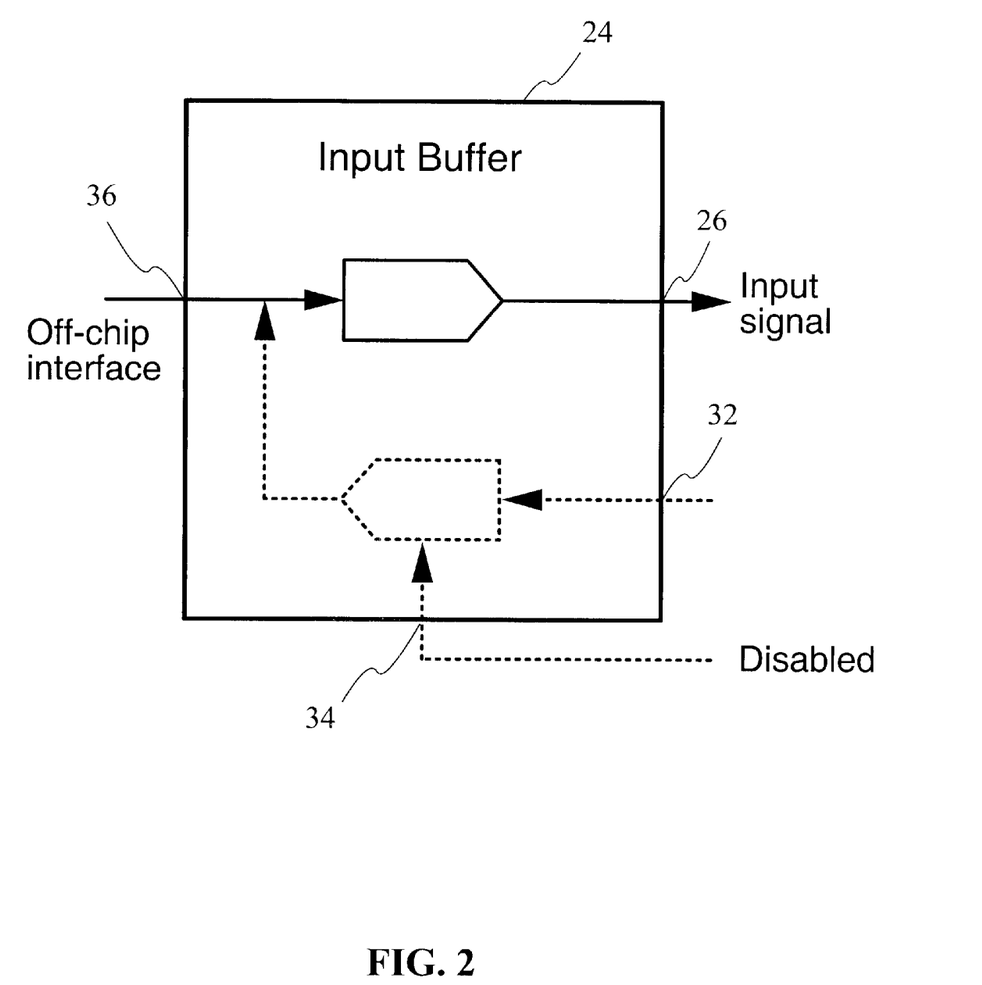
FIG. 2 shows a bi-directional I/O buffer as used for the "input" function.
Figure 3:
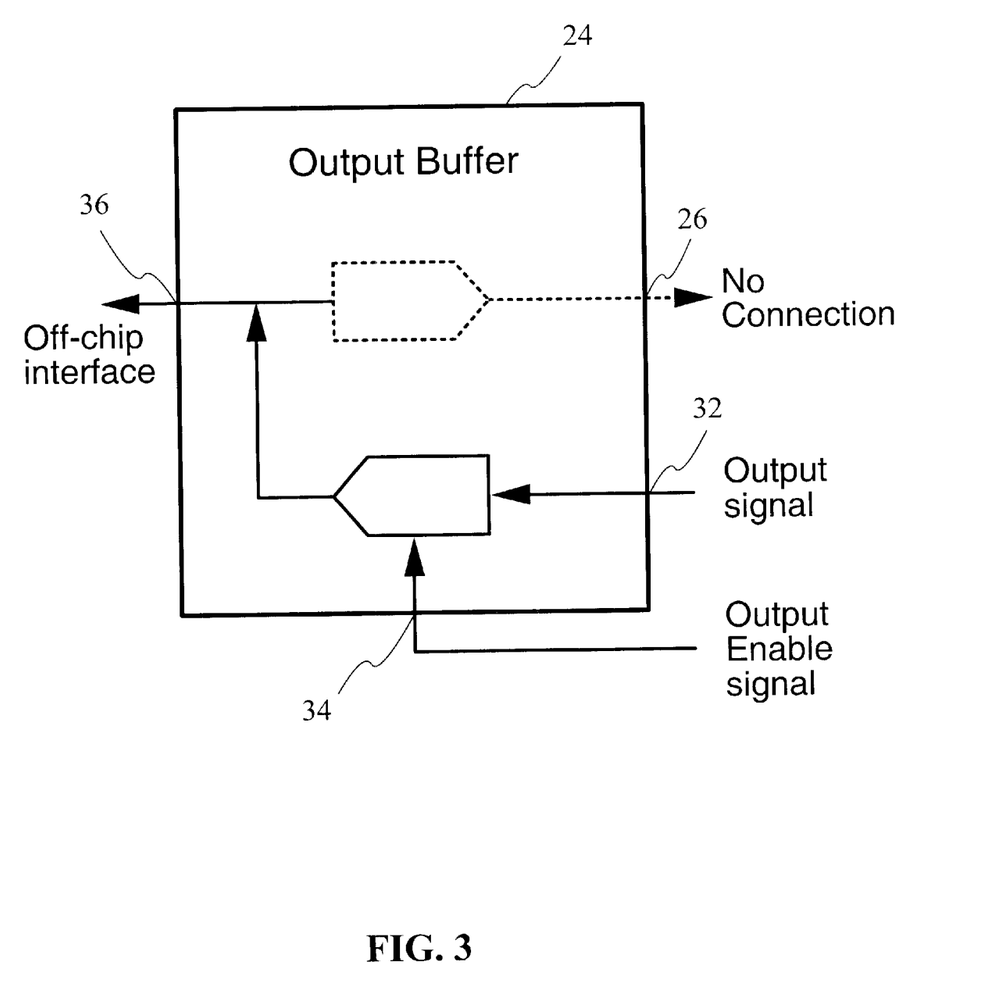
FIG. 3 shows a bi-directional I/O buffer as used for the "output" function.
Figure 4:
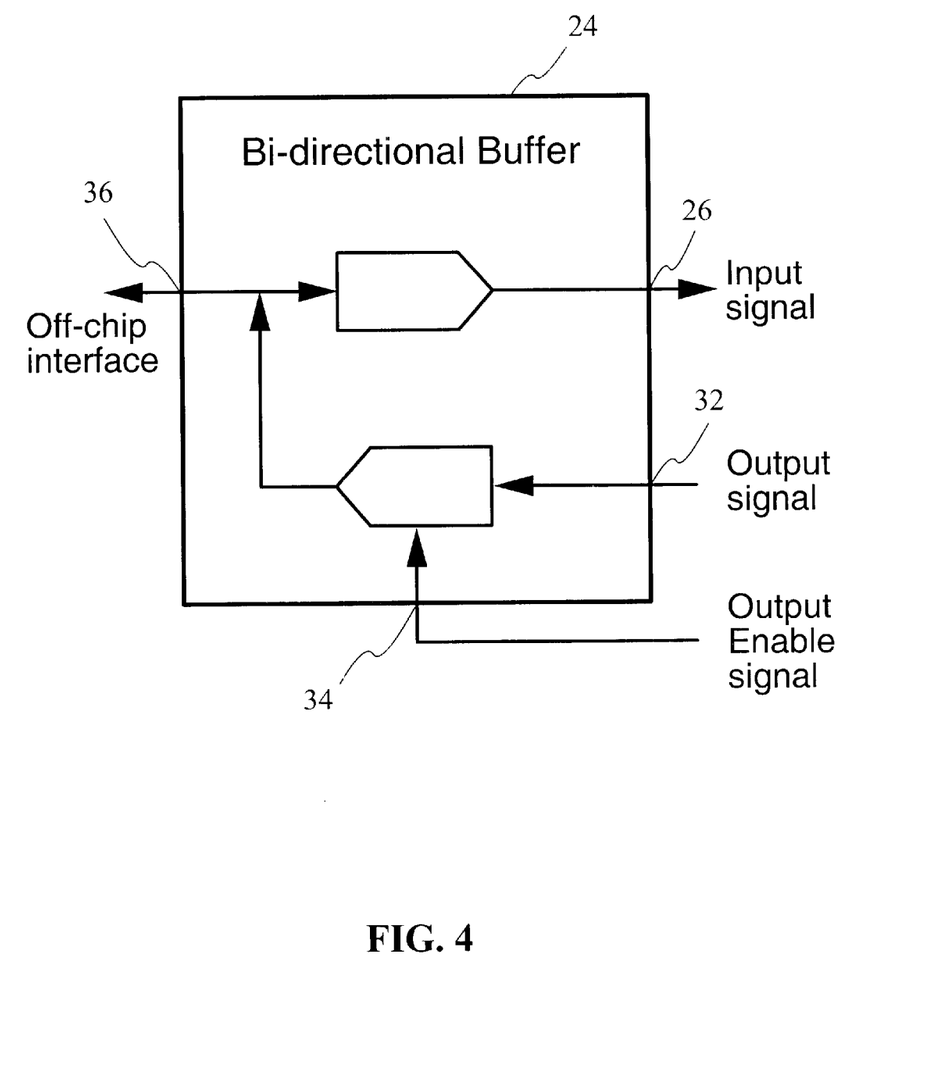
FIG. 4 shows a bi-directional I/O buffer as used for the bi-directional function.

The bi-directional I/O buffers 14 used in the multi-design die 10 of the present invention may each be operated either as an input buffer as shown in FIG. 2, as an output buffer as shown in FIG. 3 or as a bi-directional buffer as shown in FIG. 4. Furthermore a bi-directional I/O buffer may be left unconnected if so required by the multi-design netlist.

In FIG. 2, bi-directional I/O buffer 24 has an input signal port 26, an output signal port 32, an output enable port 34 and an off-chip interface port 36. The off-chip interface port 36 is connected to a bonding pad, not shown. The bi-directional I/O buffer 24 operates, in this case, as an input buffer because a signal applied to the output enable terminal 34 disables the output portion of the I/O buffer shown in dotted lines.

In FIG. 3 the bi-directional I/O buffer 24 operates as an output buffer because an output enable signal is applied to the output enable signal port 34 and because the input signal port 26 is not connected.

In FIG. 4 the bi-directional I/O buffer functions as a bi-directional buffer for transmitting input signals and output signals. In this case, the output function is enabled by the output enable signal applied to the output enable signal port 34, and the input signal port 26 is connected to at least one input port on a design, not shown in FIG. 4.

The multi-design netlist includes the individual netlist for each design and also includes an additional netlist that defines additional logic for multiplexors and control signals such that for each Bi-directional I/O buffer the four functions of "input", "output", bi-directional" and "no-connect" functions are implemented as required to operate any one of the designs.

The function required of a given bi-directional I/O buffer will change depending on which of the designs is active. Any one design may require any one of the four functions enumerated above. By way of illustration, if there are only two designs there are ten possible combinations of first design function and second design function. Table 1 shows these ten combinations, designated case #1 to case #10.

TABLE 1

|  |  | Design #1 | | | |
| --- | --- | --- | --- | --- | --- |
|  |  | Input | Output | Bi-directional | No Connect |
| Design #2 | Input | Case #1 | Case #2 | Case #4 | Case #7 |
|  | Output |  | Case #3 | Case #5 | Case #8 |
|  | Bi-directional |  |  | Case #6 | Case #9 |
|  | No Connect |  |  |  | Case #10 |

The implementation of cases 4 and 6 will now be discussed in detail.

Figure 5:
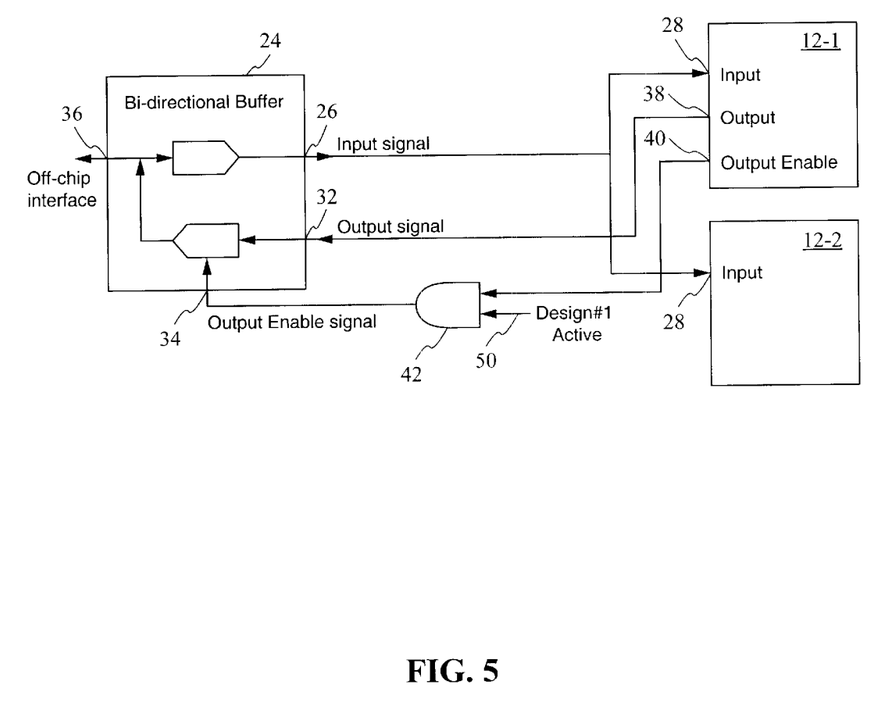
FIG. 5 shows one example of connections to a bi-directional I/O buffer in a multi-design integrated circuit die that contains two designs, in accordance with the present invention.

FIG. 5 shows a schematic of buffer connections and output controllogic that can be used for case number 4. In case number 4 the bi-directional I/O buffer is required to perform the "bi-directional" function when design 12-1 is active and to perform "input" function when design 12-2 is active. The bi-directional I/O buffer 24 has an input signal port 26 that is electrically connected to an input port 28 in design 12-1 and to an input port 28 in design 12-2, so that any input signal applied to a bonding pad (not shown) is transmitted by the I/O buffer 24 to the two input ports 28. The output port 38 in design 12-1 is connected to the output signal port 32 of the I/O buffer 24. The output enable port 40 of design 12-1 is inputted to AND gate 42. A design #1 active signal is applied via a design active signal line 50 to AND gate 42. The output control logic in this case is the output enable logic consisting of AND gate 42. The output of AND gate 42 is the output enable signal that is applied to the output enable signal port 34 of buffer 24. In this case, when the design #1 active signal makes design 12-1 active, the output function of the bi-directional buffer 24 is enabled, and the output signal from output port 38 of design 12-1 appears at off-chip interface 36.

If design 12-2 is active (made active by a design #2 signal, not shown in FIG. 5), then the output enable signal from the output enable port 40 of design 12-1 is blocked at the AND gate 42 and the bi-directional I/O buffer 24 performs the "input" function only.

Figure 6:
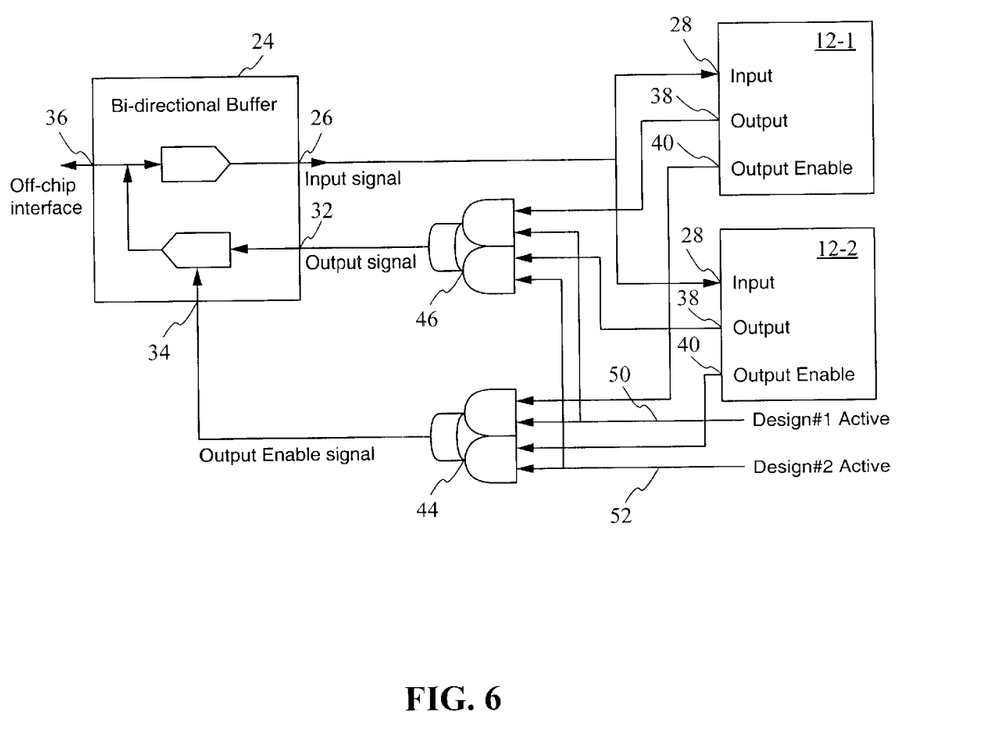
FIG. 6 shows another example of connections to a bi-directional I/O buffer in a multi-design integrated circuit die that contains two designs in accordance with the present invention.

FIG. 6 shows a schematic of the connections and output control logic that can be used to implement case 6. In case 6, the bi-directional I/O buffer 24 is required to perform the "bi-directional" function for design 12-1 and also for design 12-2.

The output control logic in this case includes output enable control logic 44 and output selection logic 46. When the design #1 active signal on line 50 is high and design #2 active signal on line 52 is low, then the output enable signal from output enable port 40 of design 12-1 is sent by the output enable logic 44 to the output enable signal port 34 of the buffer 24 and buffer 24 is output enabled. Again, when design #1 active signal is high on line 50 and design # 2 active signal is low on line 52, then design 12-1 is selected and active, the output signal from output port 38 of design 12-1 is passed via output selection logic 46 to the output signal port 32 of the buffer 24 and appears at port 36 of the buffer 24. At the same time any output signal from output port 38 of design 12-2 is blocked by output selection logic 46.

When design #2 signal is high on line 52, the operation is similar except that the output enable signal from output enable port 40 of design 12-2 output enables buffer 24, and the output signal from output port 38 of design 12-2 is transmitted by logic 46 while the output signal from output port 38 of design 12-1 is blocked by logic 46.

The design of a multi-design die in accordance with the present invention includes, as stated above, generating a multi-design netlist. The design software requires that for each design, the pin-pad-buffer assignments be defined. The user of each design can supply this information. The pin-pad-buffer assignments for the individual designs are combined by software to provide a pin-pad assignment table for the multi-design integrated circuit die. Table 2 is an example of such a pin-pad assignment table for an oversimplified situation.

TABLE 2

Pin-Pad Assignment table example:

| Pin # | Pad # | Design #1 | Design #2 | Design #3 | Design #4 | To Design |
|-------|-------|-----------|-----------|-----------|-----------|-----------|
| 1 | 1 | Input | Output | Input | Bi-Dir | Bi-Dir |
| 2 | 2 | NC | Bi-dir | Output | Bi-Dir | Bi-Dir |
| 3 | 3 | Bi-Dir | Input | Bi-Dir | NC | Bi-Dir |
| 4 | 4 | Vdd | Vdd | Vdd | Vdd | Vdd |
| 5 | 5 | Vss | Vss | Vss | Vss | Vss |

Table 2 shows pin-pad assignments for 4 designs and five pins including $V_{dd}$ and $V_{ss}$ pins. The body of the table shows the buffer functions required between each pin and the pads in each design. In the first column of table 2, "pin #" refers to package pin number. In the second column of the table "pad #" refers to pad numbers in each design, for example "pad #" 1 refers to input pad 1 or output pad 1 or both, as required. Pad number 1 refers to input pad 1 in design 1, to output pad 1 in design 2, to input pad 1 in design 3, and to both input pad 1 and output pad 1 in design 4.

Taking pin 1 for example, the input function is required between pin 1 and pad 1 of design 1, thus pin 1 is assigned to input port 1 of design 1. The output function is required between pin 1 and pad 1 of design 2, thus pin 1 is also assigned to output port 1 of design 2. The input function is required between pin 1 and pad 1 of design 3. The bi-directional function is required between pin 1 and pad 1 of design 4, thus pin 1 is also assigned to input port 1 and to output port 1 of design 4. In the rightmost column of table 2, the top-level design requires a bi-direction buffer for pin 1.

Note that pin 3 is not assigned to any pad in design 4 as is indicated by the notation NC, meaning not connected. Though not shown in Table 2, a pin and its associated I/O buffer may not be assigned to a pad in any design, in which case it is assigned to zero input ports and to zero output ports.

From table 2 it can be said that if there are N designs then an input pin may be assigned an input port in each of M designs and to an output port in each of P designs, where M and P are integers in the set of integers zero through N. term "pads" at the head of column 2 in table 2 derives from the fact that if a design is fabricated as a single design integrated circuit then its input ports and output ports would each require a bonding pad. These bonding pads are eliminated in the multi-design structure, though the design input ports and output ports remain. The term "pad" is, however, retained in table 2.

The column headed "top design" shows that bi-directional buffers are required for certain of the pins. In generating the multi-design netlist, design automation techniques can be used to remove buffers from the design netlists and insert bi-directional I/O buffers in the multi-design netlist where they are shared by the lower level netlists. The software will also read the pin-pad assignment for each design so that the overall pin-pad assignments are correctly generated.

Figure 7:
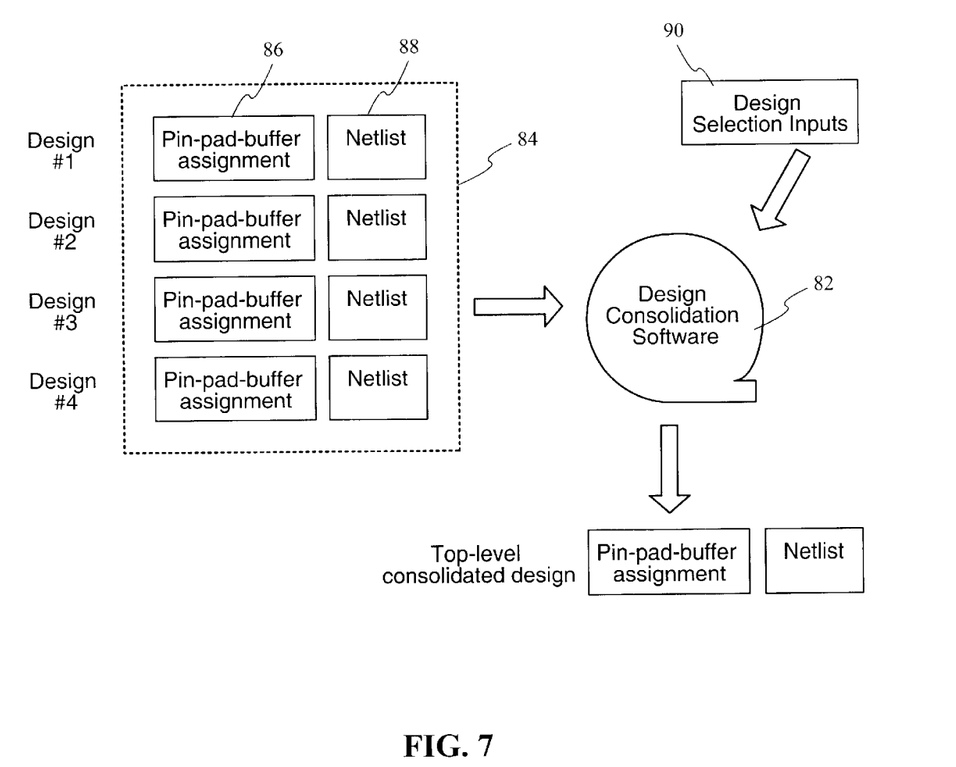
FIG. 7 is a flow diagram showing the overall function of design consolidation software in accordance with the present invention.

FIG. 7 shows a flow diagram for the operation of generating a top-level consolidated design for a multi-design integrated circuit. In FIG. 7 design consolidation software 82 receives data 84 for all of the designs that are to be built in a single multi-design die. The data 84 includes, for each design, pin-pad-buffer assignment 86 and a netlist 88. The design consolidation software may also receive design selection inputs 90. The design selection inputs are configuration information externally applied to the consolidated design. This configuration information can be implemented by tying input pins to either the high or low states. Alternatively, the high or low state termination can be achieved by wire-bonding techniques during the assembly process. The design consolidation software outputs a top-level consolidated design for a multi-design integrated circuit die containing pin-pad-buffer assignment and top-level netlist or multi-design netlist.

Each netlist represents a complete design. The designer generates simulation vectors for each design. The simulation vectors from each design are combined into one set of simulation vectors for the top-level design. Design automation techniques can be used to automate this process. The combined vector set will then be used for generating a semiconductor production test program to test the multi-design device.

Figure 8:
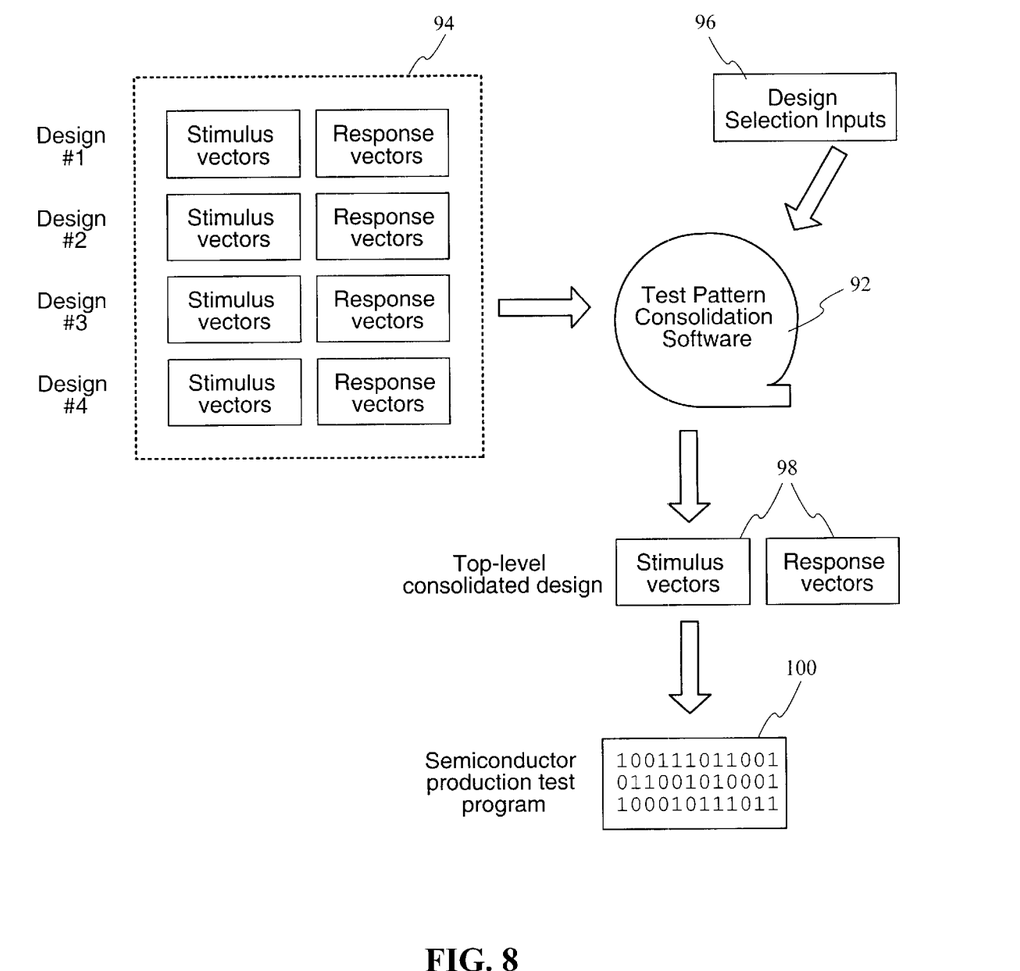
FIG. 8 is a flow diagram showing the overall function of test consolidation software, in accordance with the present invention.

FIG. 8 is a flow diagram illustrating the process of test vector consolidation. In FIG. 8 test pattern consolidation software 92 receives data 94 for all of the designs that are to be included in a multi-design chip. The data 94 includes stimulus vectors and response vectors for each design. The test pattern consolidation software may also receive design selection inputs 96. The test pattern consolidation software outputs data 98 including stimulus vectors and response vectors, both for the top-level consolidated design. From the stimulus vectors and response vectors 98 a semiconductor test program 100 is generated for the multi-design integrated wafers and devices.

Once the design consolidation of FIG. 7 and the test pattern consolidation of FIG. 8 have been completed, the physical layout of the multi-design chip is generated and a mask set is created. The masks are used in a wafer fabrication facility to process a batch of semiconductor wafers. The processed wafers are probe tested using the semiconductor production test program and the good multi-design dice are identified. The wafers are cut into individual multi-design dice. Each die is then attached to an integrated circuit package. The bonding pads are connected to the package external leads and the package is sealed. The packaged multi-design integrated circuits are again tested.

Exemplary embodiments of the present invention have been described. These are intended to be illustrative and not restrictive. Thus, the present invention is capable of many variations in detailed implementation, which variations may be derived from the description contained herein by a person of ordinary skill in the art. All such variations are considered to be within the scope of the appended claims.

What is claimed is:

1. An integrated circuit die, comprising:
   at least two integrated circuit designs each is set active or inactive by a corresponding design active signal;
   bi-directional I/O buffers; and output control logic; wherein at least one of said I/O buffers is connected to said at least two designs for transmitting input signals thereto, and wherein said at least one I/O buffer is connected through said output control logic such that said output control logic permits said at least one I/O buffer to output an output signal only if said output signal is from a design that is active.

2. The integrated circuit die of claim 1, wherein each of said at least two designs comprises input ports, at least one output port, and an associated output enable port for each of said at least one output port, wherein said at least one I/O buffer is connected to at least one input port of each of said at least two designs.

3. The integrated circuit die of claim 1, wherein said control logic comprises output enable control logic for receiving an output enable signal from an output enable port of a design, for receiving a corresponding design active signal for said design, and for outputting said output enable signal to said at least one I/O buffer only when said design is an active design.

4. The integrated circuit die of claim 3, wherein said output control logic further includes output selection logic for receiving output signals from an output port in each of said at least two designs, for receiving a corresponding design active signal for each of said at least two designs, and for outputting to said at least one I/O buffer said output signal from said active design if said active design is one of said at least two designs.

5. The integrated circuit die of claim 1, wherein said at least two designs are located in a core area of the die and said bi-directional I/O suffers are located in a peripheral area of the die.

6. The integrated circuit die of claim 5, further comprising:

bonding pads connected to said bi-directional I/O buffers and located in the peripheral area of the die.

* * * * *